United States Patent
Yamazaki et al.

(10) Patent No.: US 6,856,218 B2
(45) Date of Patent: Feb. 15, 2005

(54) SURFACE ACOUSTIC WAVE DEVICE AND COMMUNICATIONS APPARATUS USING THE SAME

(75) Inventors: Takashi Yamazaki, Minowa-machi (JP); Keigo Iizawa, Minowa-machi (JP); Shigeo Kanna, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 40 days.

(21) Appl. No.: 10/329,445

(22) Filed: Dec. 27, 2002

(65) Prior Publication Data

US 2003/0146810 A1 Aug. 7, 2003

(30) Foreign Application Priority Data

Dec. 28, 2001 (JP) ........................................ 2001-399544
Nov. 8, 2002 (JP) ........................................ 2002-324720

(51) Int. Cl.⁷ .............................................. H03H 9/64
(52) U.S. Cl. .................... 333/193; 333/195; 310/313 A
(58) Field of Search ................................. 333/193–196, 333/133; 310/313 A

(56) References Cited

U.S. PATENT DOCUMENTS

| | | | | |
|---|---|---|---|---|
| 4,670,681 A | * | 6/1987 | Wright | .................... 310/313 A |
| 5,895,996 A | * | 4/1999 | Takagi et al. | ........... 310/313 R |
| 6,031,315 A | * | 2/2000 | Abbott | ................... 310/313 A |
| 6,154,105 A | * | 11/2000 | Fujimoto et al. | ........... 333/194 |

FOREIGN PATENT DOCUMENTS

| | | | | |
|---|---|---|---|---|
| JP | 61-73409 | * | 4/1986 | ............. 310/313 R |
| JP | 09-148879 | | 6/1997 | |
| JP | 2000-323955 | | 11/2000 | |
| JP | 3216137 | | 8/2001 | |

* cited by examiner

*Primary Examiner*—Barbara Summons
(74) *Attorney, Agent, or Firm*—Oliff & Berridge, PLC

(57) ABSTRACT

The invention provides an in-plane rotational ST-cut SAW resonator that is formed of an in-plane rotational ST-cut crystal plate having Eulerian angles of (0°, 113° to 135°, and ±(40° to 49°)). The in-plane rotational ST-cut SAW resonator can include an interdigital transducer (IDT) electrode for exciting a Rayleigh wave on the main surface. The ratio Lt/Pt of the electrode width Lt and the interelectrode pitch Pt of the IDT electrode is 0.5 or more and 0.65 or less. Accordingly, a reduction in the fluctuation in resonance frequency relative to the variations in an IDT electrode of a surface acoustic wave device by using the in-plane rotated ST-cut crystal plate around the Z'-axis can be achieved.

2 Claims, 15 Drawing Sheets

(1)

(2)

SURFACE ACOUSTIC WAVE DEVICE AND COMMUNICATIONS APPARATUS USING THE SAME

BACKGROUND OF THE INVENTION

1. Field of Invention

The present invention relates to a surface acoustic wave device using crystal glass. More specifically, the invention relates to a surface acoustic wave device using a so-called in-plane rotational ST-cut crystal plate, and a communications apparatus using the same.

2. Description of Related Art

Surface acoustic wave devices represented by surface acoustic wave resonators and surface acoustic wave filters utilizing a surface acoustic wave (SAW) use a planar piezoelectric material. Known surface acoustic wave devices have an IDT (Interdigital Transducer) electrode on the main surface of a piezoelectric flat plate and has reflectors on both sides of the IDT electrode to oscillate a high frequency region stably. ST-cut surface acoustic wave devices are known in which an ST-cut crystal plate is used as a piezoelectric material that forms a surface acoustic wave device for the purpose of reducing the fluctuation in frequency relative to temperature changes and in which the X-axis (electrical axis) of the ST-cut crystal plate is the propagating direction of the surface acoustic wave.

FIG. 2 is an explanatory diagram of an SAW resonator, which is an example of the surface acoustic wave device, wherein (1) is a plan view thereof and (2) is a partly cutaway sectional view taken along line A—A of (1). As shown in FIG. 2(1), an SAW resonator 10 uses, for example, an ST-cut crystal plate 12 as a substrate, having an IDT electrode 14 at the center of the main surface of the substrate. The IDT electrode 14 can be composed of a comb-like positive electrode 14a and a negative electrode 14b, wherein one comb-like electrode piece is arranged between the other comb-like electrode piece. The SAW resonator 10 applies high-frequency voltage to the positive electrode 14a and the negative electrode 14b of the IDT electrode 14 to generate surface acoustic waves.

Also, reflectors 16 (16a and 16b) having a plurality of short-circuit electrodes are disposed on both sides of the IDT electrode 14. The reflectors 16 reflect the surface acoustic waves toward the IDT electrode 14. For example, Japanese unexamined patent application publication number JP9-148879 discloses that a ratio of the electrode width to the pitch of electrodes can be set to 0.65 or more in order to reduce the frequency fluctuation due to the formation error of the IDT electrode. More specifically, it is disclosed that $\eta \geq 0.65$ must be satisfied where the ratio of an electrode width Lt and an interelectrode pitch Pt, which are shown in FIG. 2(2), is $\eta$. Reference symbol Ht shown in this drawing denotes the thickness (film thickness) of the IDT electrode 14.

SUMMARY OF THE INVENTION

Recently, the demand for surface acoustic wave devices having high resonance frequency has increased with the enhancement of the performance and function of electronic equipment, so that the interelectrode pitch Pt of the IDT electrode 14 of the SAW resonator 10 is decreasing. Therefore, if the ratio $\eta$ of the electrode width Lt to the interelectrode pitch Pt of the IDT electrode 14 is set to 0.65 or more, the distance between the positive electrode 14a and the negative electrode 14b that are adjacent to each other decreases extremely, which may establish a short circuit between the positive electrode 14a and the negative electrode 14b only by the adhesion of a minute article. Decreasing the electrode width Lt of the IDT electrode 14 to avoid the short circuit between the electrodes 14a and 14b tends to cause the breaking of electrode line. Accordingly, there has been a strong demand for the development of a surface acoustic wave device having low frequency fluctuation relative to the variations in the width of the IDT electrode 14.

On the other hand, for the purpose of further reducing the frequency fluctuation due to temperature changes, sometimes an ST-cut crystal plate 12 is rotated in plane around the Z'-axis (refer to FIG. 1), and the in-plane rotated ST-cut crystal plate around the Z'-axis is used. However, even in the surface acoustic wave device that uses such an in-plane rotated ST-cut crystal plate around the Z'-axis, the resonance frequency varies depending on the value $\eta$. In brief, the variations in the electrode width of the IDT electrode may vary the resonance frequency of the formed surface acoustic wave device. Also, even the surface acoustic wave devices formed in the same wafer can vary in resonance frequency because of the variations in electrode width. Therefore, it is difficult to control the resonance frequency on a wafer basis. Therefore, the frequencies of the surface acoustic wave devices must be controlled individually when it is mounted in a package or the like, which can be both time and labor intensive in order to control the resonance frequency. Reducing the variations in the resonance frequency of the surface acoustic wave device due to the formation error of the electrode width requires a high-precision aligner or the like. Thus, the cost of equipment is increased, resulting in an increase in the cost of the surface acoustic wave device.

The present invention has been made to solve the foregoing problems and, accordingly, an object thereof is to reduce the fluctuation in resonance frequency relative to the variations in the IDT electrode of the surface acoustic wave device that uses an in-plane rotated ST-cut crystal plate around the Z'-axis.

Also, another object of the present invention is to facilitate regulating the frequency of the surface acoustic wave device.

The inventors conducted research, examination, and experiment in various ways on an SAW resonator using an in-plane rotated ST-cut crystal plate around the Z'-axis (hereinafter, sometimes simply referred to as an in-plane rotational ST-cut). As a result, it has been found that cut angles at which the fluctuation in frequency relative to temperature changes is small and the fluctuation in resonance frequency relative to the variations in the electrode width Lt is around $\eta=0.5$.

An SAW resonator according to the present invention is a surface acoustic wave resonator having an IDT electrode for exciting a Rayleigh wave on the main surface of an in-plane rotational ST-cut crystal plate having Eulerian angles of $(0°, 113°$ to $135°,$ and $\pm(40°$ to $49°))$, which is characterized in that the ratio Lt/Pt of the electrode width Lt and the interelectrode pitch Pt of the IDT electrode is 0.5 or more and 0.65 or less.

In the present invention with such an arrangement, the fluctuation in resonance frequency can remarkably be reduced with respect to the variations in the electrode width of the IDT electrode. Therefore, there is no need for an expensive and high-precision aligner and so on to reduce the fluctuation in resonance frequency due to the formation error of the electrode width. Also, not only photolithography processing and etching processing, but also the frequency of the formed SAW resonator can easily be controlled. Thus, the time for controlling the frequency can be decreased and the cost can be reduced.

Preferably, if the Eulerian angles are expressed by ($\phi$, $\theta$, and $\pm\psi$), the lower limit of $\psi$ is within the range of $|\psi|=|-0.317\theta+81.82°|$, and the upper limit is within the range of $|\psi|=|0.160\theta+27.78°|$. A communications apparatus according to the present invention can include the above-described surface acoustic wave device.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

A preferable embodiment of a surface acoustic wave device and a communications apparatus using the same, according to the present invention, will be specifically described with reference to the attached drawings. Components corresponding to the components described in the conventional art will be denoted by the same numerals and a description thereof will be omitted.

Figure 1:
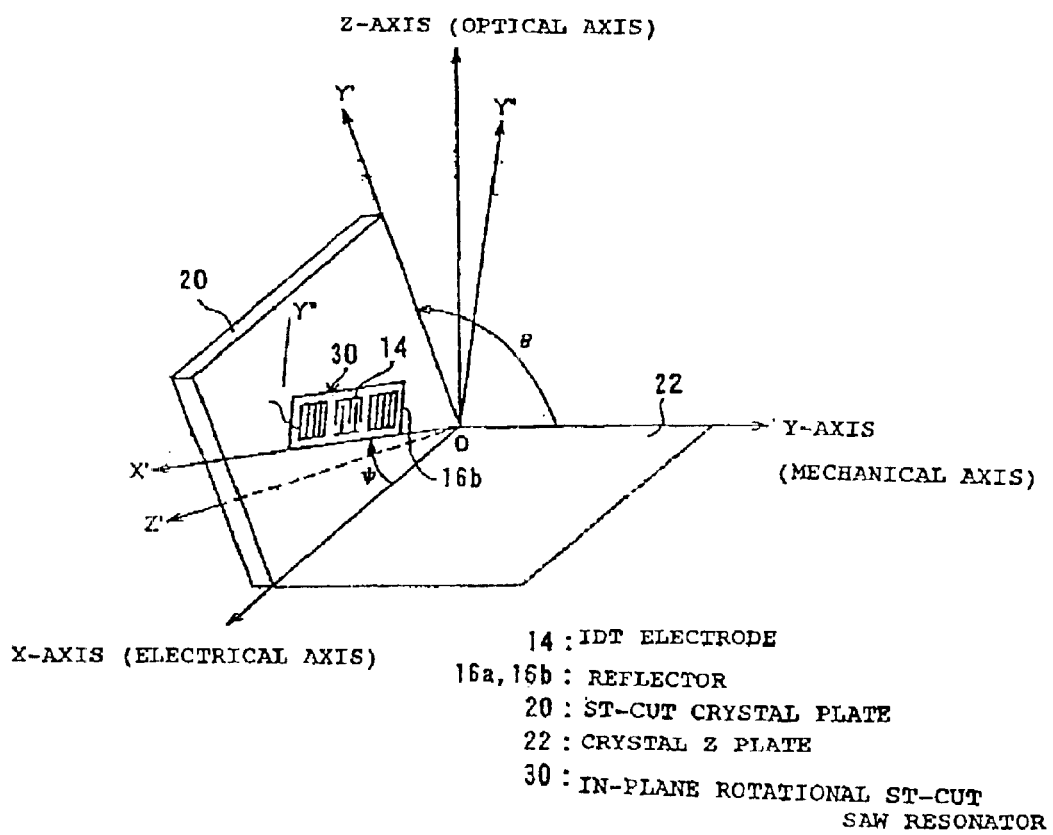
FIG. 1 is an explanatory view of an in-plane rotated ST-cut crystal around the Z'-axis.

FIG. 1 is an exemplary diagram explaining the cut angles of crystal for obtaining a surface acoustic wave resonator (SAW resonator) according to the present invention. In FIG. 1, the X-axis, Y-axis, and Z-axis represent the respective crystallographic axes of the crystal, wherein the X-axis is a so called electrical axis, the Y-axis is a mechanical axis, and the Z-axis is an optical axis.

An ST-cut crystal plate 20 for forming an ST-cut SAW resonator is obtained by rotating a crystal Z plate 22 having Eulerian angles of (0°, 0°, and 0°) around the X-axis by $\theta=113°$ to 135° and cutting it out along the crystallographic axes (X, Y', and Z') at that time. An in-plane rotational ST-cut SAW resonator 30 according to the embodiment of the present invention is formed of a crystal plate obtained by rotating the ST-cut crystal plate 20 in a XY'-plane that is a main surface of the ST-cut crystal plate 20. More specifically, the in-plane rotational ST-cut SAW resonator 30 is an in-plane rotated ST-cut crystal plate around the Z'-axis formed such that the ST-cut crystal plate 20 is further rotated around the Z'-axis by $\psi=\pm(40°$ to 49°) so that the surface acoustic wave is propagated along the X'-axis which is an electrical axis. The in-plane rotational ST-cut crystal plate has a low rate of frequency changes relative to temperature changes and has an extremely high temperature characteristic.

In this manner, the in-plane rotational ST-cut SAW resonator 30 is formed using an in-plane rotational ST-cut crystal plate having Eulerian angles of (0°, 113° to 135°, and ±(40° to 49°)). The in-plane rotational ST-cut SAW resonator 30 exhibits extremely low fluctuation in resonance frequency relative to the variations in the electrode width of an IDT electrode at a certain ratio of the electrode width and the interelectrode pitch of the IDT electrode 14.

Figure 2:
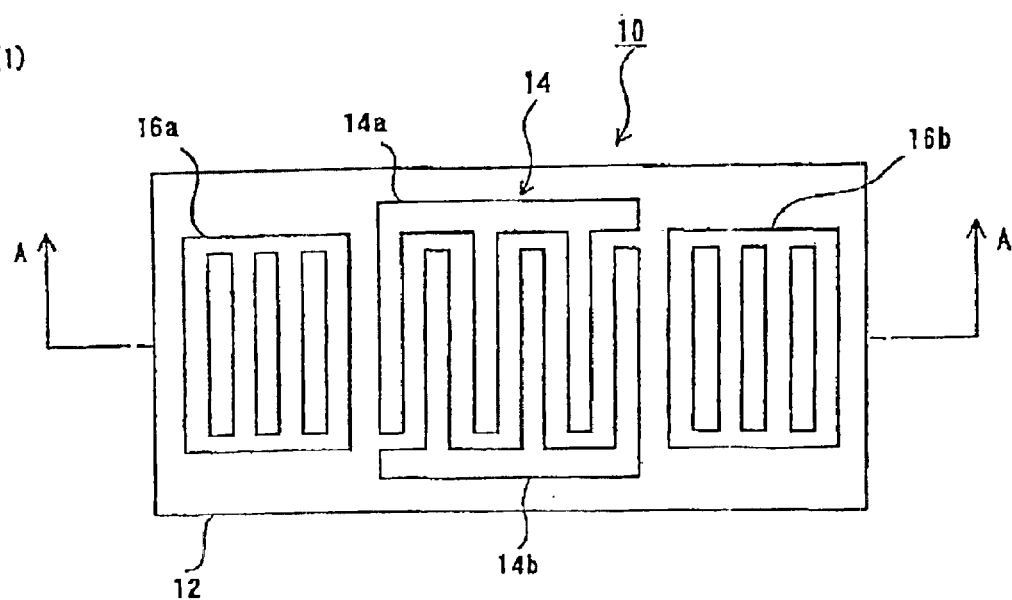
FIG. 2 is an explanatory view of an SAW resonator, wherein (1) is a plan view and (2) is a cross sectional view taken along line A—A of (1)
Figure 2:
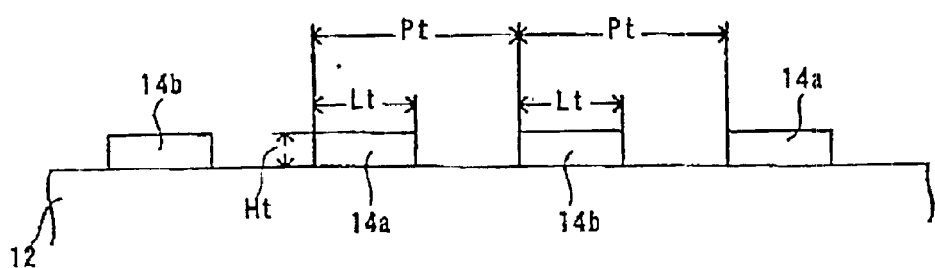
Figure 3:
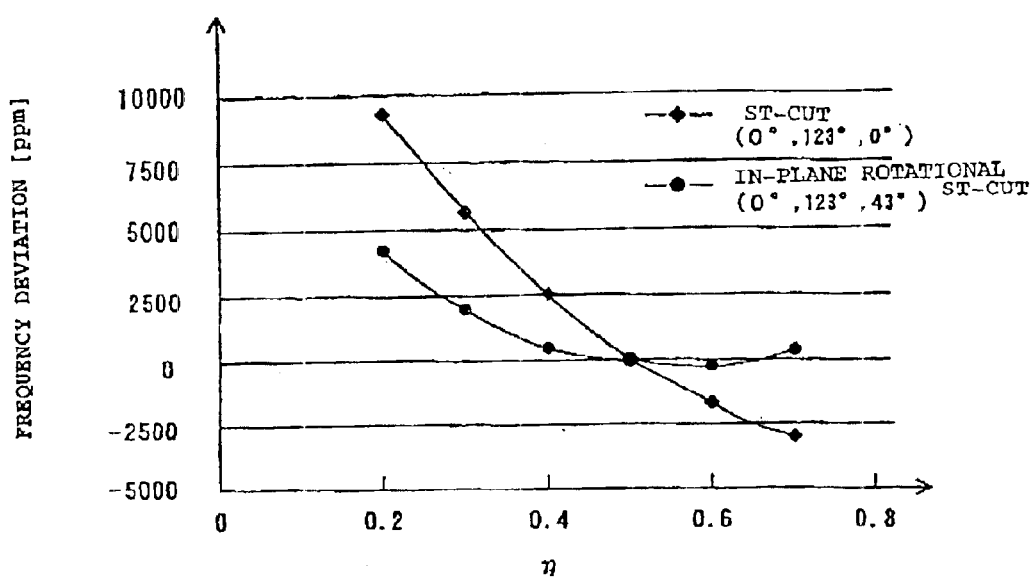
FIG. 3 is a diagram comparing the deviation of resonance frequency relative to the electrode width for a conventional ST-cut SAW resonator and an in-plane rotational ST-cut SAW resonator according to an embodiment.

FIG. 3 is a diagram comparing the relationship between the ratio $\eta$ of the electrode width (line width) to the interelectrode pitch of the IDT electrode for the in-plane rotational ST-cut SAW resonator 30 according to the embodiment of the present invention and the conventional ST-cut SAW resonator. Referring to FIG. 3, the horizontal axis indicates the ratio $\eta$ of the electrode width (Lt) to the interelectrode pitch (Pt) of the IDT electrode. The vertical axis indicates the frequency deviation of the resonance frequency in ppm. Here, η is expressed by η=(Lt/Pt) where the electrode width of the IDT electrode 14 is Lt and the interelectrode pitch is Pt, as shown in FIG. 2(2).

Referring to FIG. 3, mark ● designates the in-plane rotational ST-cut SAW resonator according to the embodiment and mark ♦ indicates the conventional ST-cut SAW resonator. The conventional ST-cut SAW resonator is formed such that the surface acoustic wave is propagated in the direction of the Eulerian angles of (0°, 123°, and 0°). The in-plane rotational ST-cut SAW resonator 30 according to the embodiment, which is rotated in plane around the Z'-axis, is formed such that the surface acoustic wave is propagated in the direction of the Eulerian angles of (0°, 123°, and 43.0°). FIG. 3 shows the coefficient of fluctuation of the resonance frequency to the resonance frequency with reference to η=0.5.

As shown in the drawing, in the in-plane rotational ST-cut SAW resonator, the fluctuation in resonance frequency relative to the variations in the electrode width Lt can remarkably be decreased by setting η in the range of 0.45≤η≤0.7. Therefore, the present invention sets the value η at 0.5 or more and 0.65 or less, that is, 0.5≤η≤0.65 in order to prevent a short-circuit between the positive electrode 14a and the negative electrode 14b of the IDT electrode 14 by the decrease in the interelectrode pitch as the SAW resonator increases in frequency and to prevent the breaking of electrode line in the IDT electrode 14.

Accordingly, in the in-plane rotational ST-cut SAW resonator 30, the fluctuation in resonance frequency (frequency deviation) due to the variations in the electrode width Lt with the formation of the IDT electrode 14 can be reduced. Therefore, the in-plane rotational ST-cut SAW resonator 30 is ready for an increase in the frequency of an SAW resonator, wherein the frequency can be controlled on a wafer basis, so that the period of time for frequency control can be shorten. Also, the control of individual resonance frequencies, which was necessary conventionally, can be omitted for some precision prescribed, thus allowing remarkable cost reduction.

The in-plane rotational ST-cut SAW resonator 30 according to the embodiment having Eulerian angles of (0°, 113° to 135°, and ±(40° to 49°)) has a minute frequency deviation relative to the variations in electrode width. Therefore, the above-described in-plane rotational ST-cut SAW resonator 30 can easily obtain an SAW resonator having frequency deviation smaller than a predetermined value without using a high-precision expensive aligner or etching device. Moreover, the in-plane rotational ST-cut SAW resonator 30 can reduce the frequency deviation associated with manufacturing, thus being able to use a large-size wafer and simplifying the control of a photolithography process.

More specifically, for an SAW resonator having a resonance frequency of 300 MHz, in order to set the deviation of resonance frequency within ±90 kHz (=±300 ppm), the variation Δη of η must be set to Δη<±0.01158 in the conventional ST-cut SAW resonator. In other words, in the conventional ST-cut SAW resonator, provided that the electrode width Lt is 2.625 μm, the tolerance of the electrode width amounts to approximately ±0.122 μm. On the other hand, in the in-plane rotational ST-cut SAW resonator 30 according to this embodiment, for obtaining resonance frequency having a deviation of ±90 kHz, Δη<±0.04181 is satisfied, and provided that the electrode width Lt is 2.718 μm, the tolerance of the electrode width amounts to approximately ±0.454 μm.

For an SAW resonator having a resonance frequency of 1 GHz, in order to set the allowable deviation of resonance frequency to ±300 kHz (=±300 ppm), Δη<±0.01158 must be satisfied in the conventional ST-cut SAW resonator. Therefore, in the conventional ST-cut SAW resonator, provided that the electrode width Lt is 0.787 μm, the tolerance of the electrode width Lt amounts to approximately ±0.036 μm. On the other hand, in the in-plane rotational ST-cut SAW resonator 30 according to this embodiment, Δη<±10.04181 is satisfied, and provided that the electrode width Lt is 0.815 μm, the tolerance amounts to approximately ±0.136 μm. In other words, in the in-plane rotational ST-cut SAW resonator 30 of this embodiment, the tolerance of the variations in electrode width Lt is approximately 3.7 times as large as that of the conventional ST-cut SAW resonator. Consequently, in the in-plane rotational ST-cut SAW resonator 30, the control of the photolithography process and etching process can be simplified, allowing the reduction of cost.

In the foregoing calculation, the velocity of sound vs is expressed by vs=3150 m/s in the conventional ST-cut crystal plate, and vs=3261 m/s in the around-Z'-axis in-plane rotational ST-cut crystal plate.

Figure 4:
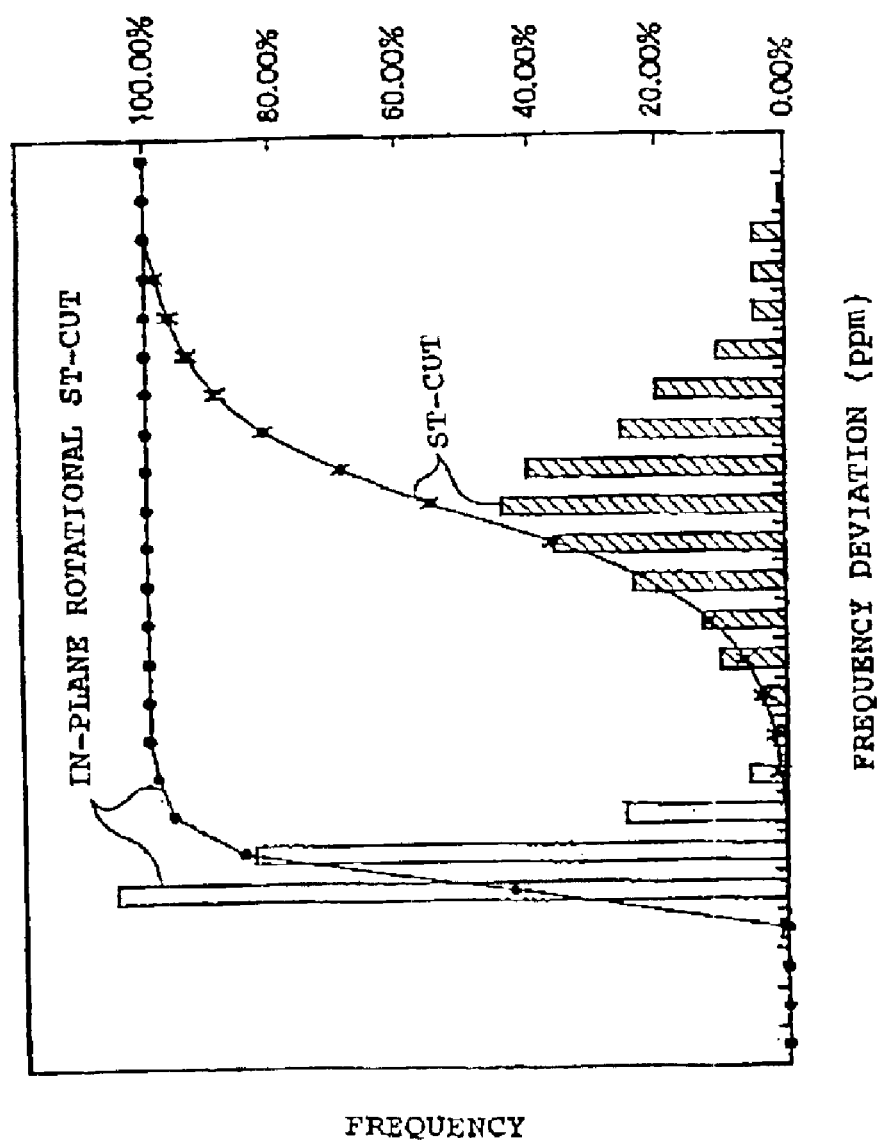
FIG. 4 is a diagram showing the variation distribution of the resonance frequencies in the same wafer for the conventional ST-cut SAW resonator and the in-plane rotational ST-cut SAW resonator according to the embodiment.

FIG. 4 shows a histogram (frequency distribution) indicating the variations in resonance frequency in the same wafer and cumulative relative frequency in percents. The hollow bar graph in the drawing indicates the frequency distribution of the in-plane rotational ST-cut SAW resonator 30 according to the embodiment and mark ● indicates the percentage of the cumulative relative frequency. The diagonally shaded bar graph in the drawing indicates the frequency distribution of the conventional ST-cut SAW resonator and mark x indicates the percentage of the cumulative relative frequency. Both the conventional ST-cut SAW resonator and the in-plane rotational ST-cut SAW resonator of the embodiment have a resonance frequency of 622 MHz. The horizontal axis in FIG. 4 indicates frequency deviation relative to a target resonance frequency 622 MHz in ppm; the left vertical axis indicates frequency; and the right vertical axis indicates the percentage of cumulative relative frequency.

As clearly shown in FIG. 4, the in-plane rotational ST-cut SAW resonator exhibits an extremely small range of variation in resonance frequency as compared with the conventional ST-cut SAW resonator. Accordingly, the frequency of the in-plane rotational ST-cut SAW resonator can easily be controlled in the state of wafer, thus eliminating the need for controlling individual frequencies as a surface acoustic wave device.

FIGS. 5 to 10 show the relationship between the ratio η(=Lt/Pt) of the electrode width Lt and the interelectrode pitch Pt of the IDT electrode and the frequency deviation (in ppm) of the resonance frequency for the cut angles of crystal plates of an around-Z-axis in-plane rotational ST-cut SAW resonator. In these drawings, the horizontal axis indicates the ratio η of the electrode width Lt to the interelectrode pitch Pt, and the vertical axis indicates the frequency deviation (in ppm) of the resonance frequency. Provided that a point where the slope of the characteristic line is 0 exists in the range of 0.5≤η≤0.65, the deviation of the resonance frequency relative to the fluctuation of η is extremely small.

Here, it has been found that the range of θ and ψ where the point at which the slope of the characteristic line is 0 exists. FIGS. 5 to 10 verify the boundary whether or not the characteristic line has a point of slope 0.

Figure 5:
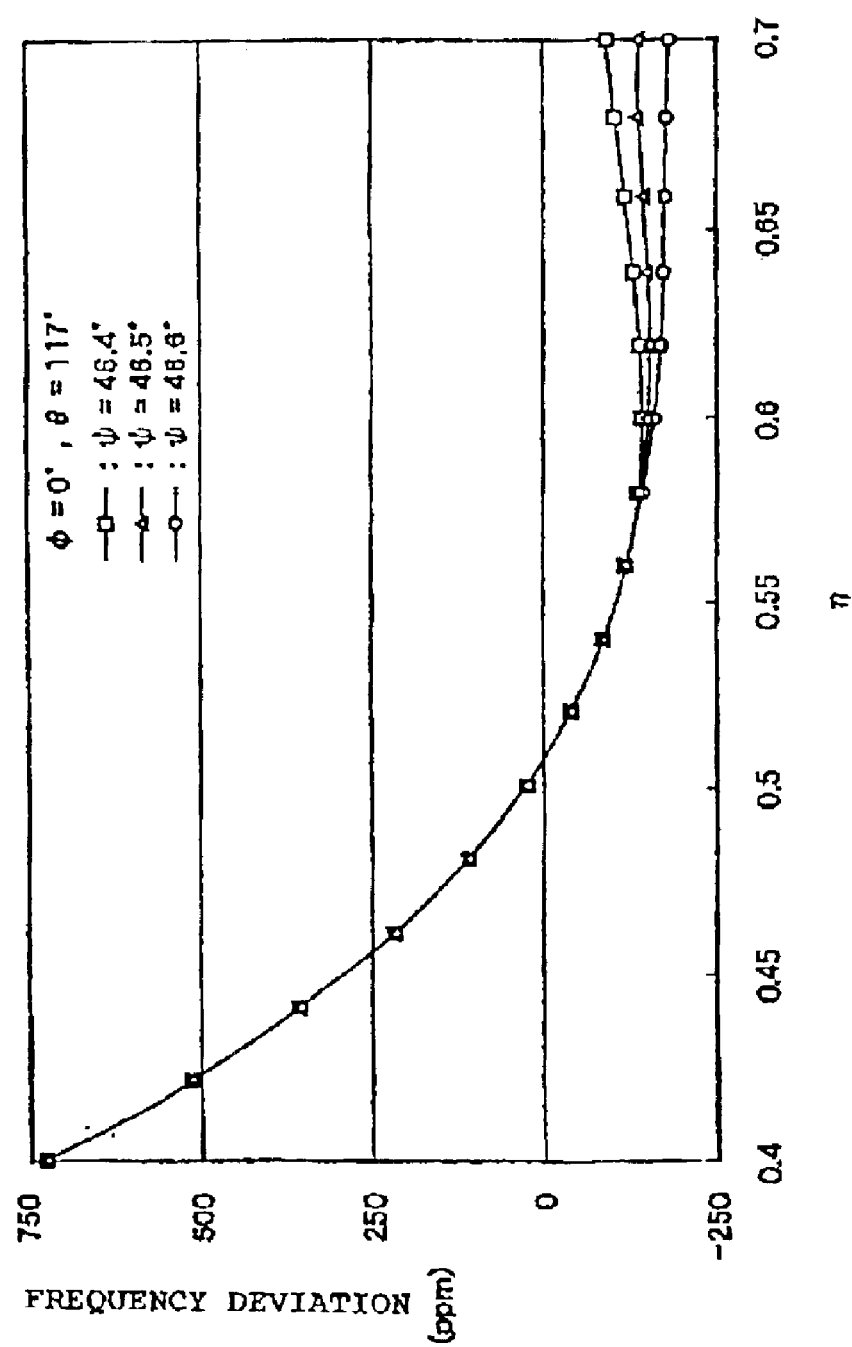
FIG. 5 is a diagram showing the relationship between the electrode width and the resonance frequency deviation of an in-plane rotational ST-cut SAW resonator having Eulerian angles of (0°, 117°, and 46.4° to 46.6°) according to the embodiment.
Figure 6:
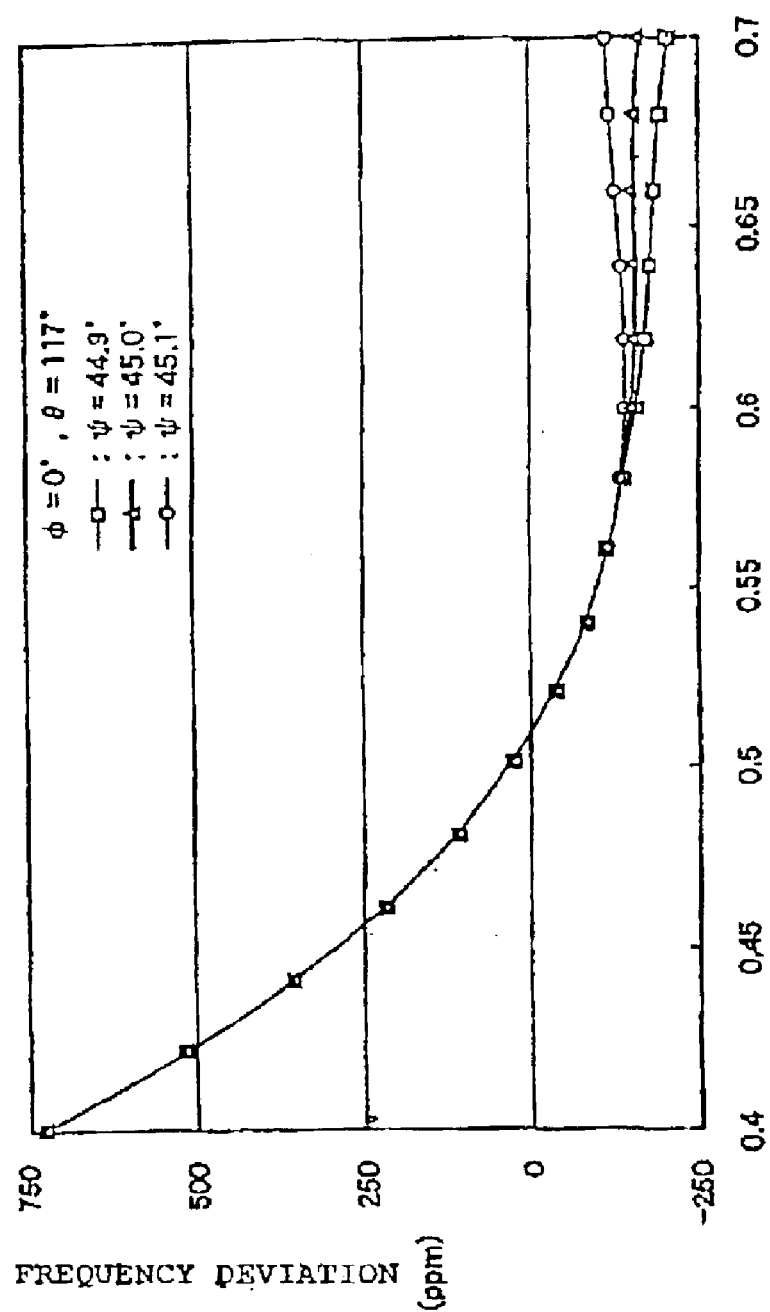
FIG. 6 is a diagram showing the relationship between the electrode width and the resonance frequency deviation of an in-plane rotational ST-cut SAW resonator having Eulerian angles of (0°, 117°, and 44.9° to 45.1°) according to the embodiment.
Figure 7:
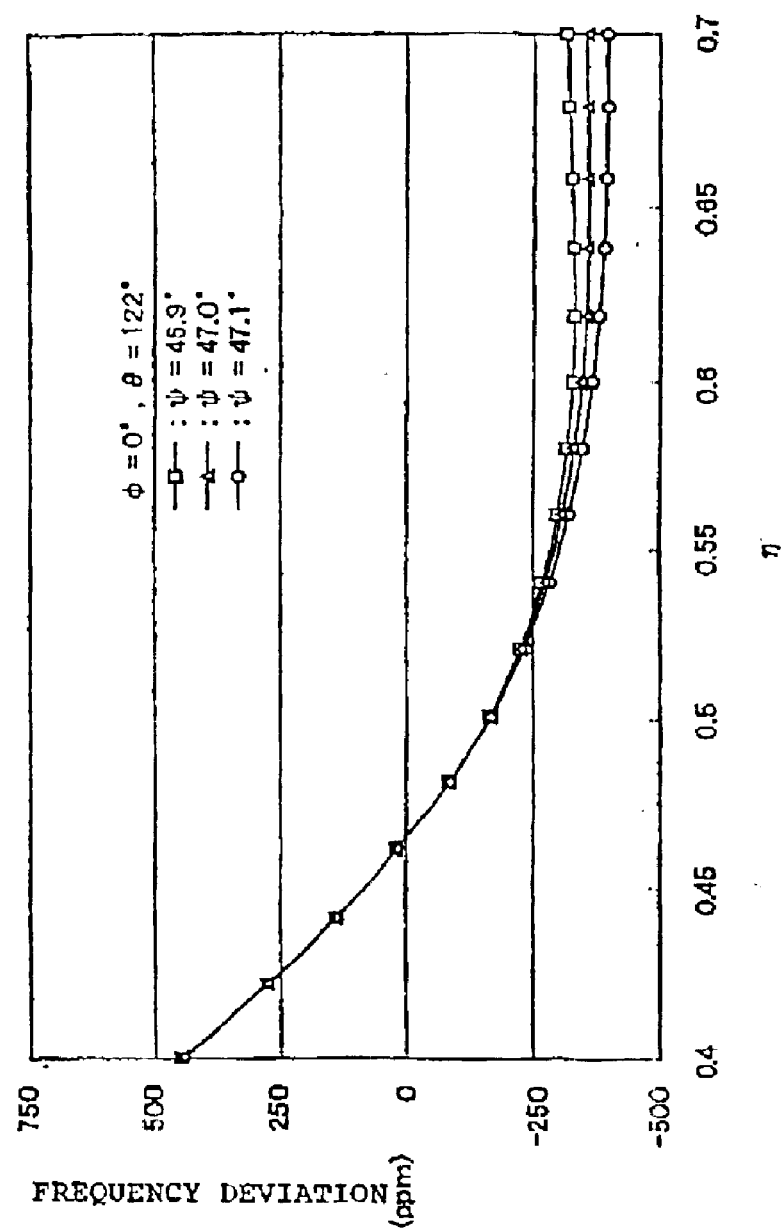
FIG. 7 is a diagram showing the relationship between the electrode width and the resonance frequency deviation of an in-plane rotational ST-cut SAW resonator having Eulerian angles of (0°, 122°, and 46.9° to 47.1°) according to the embodiment.
Figure 8:
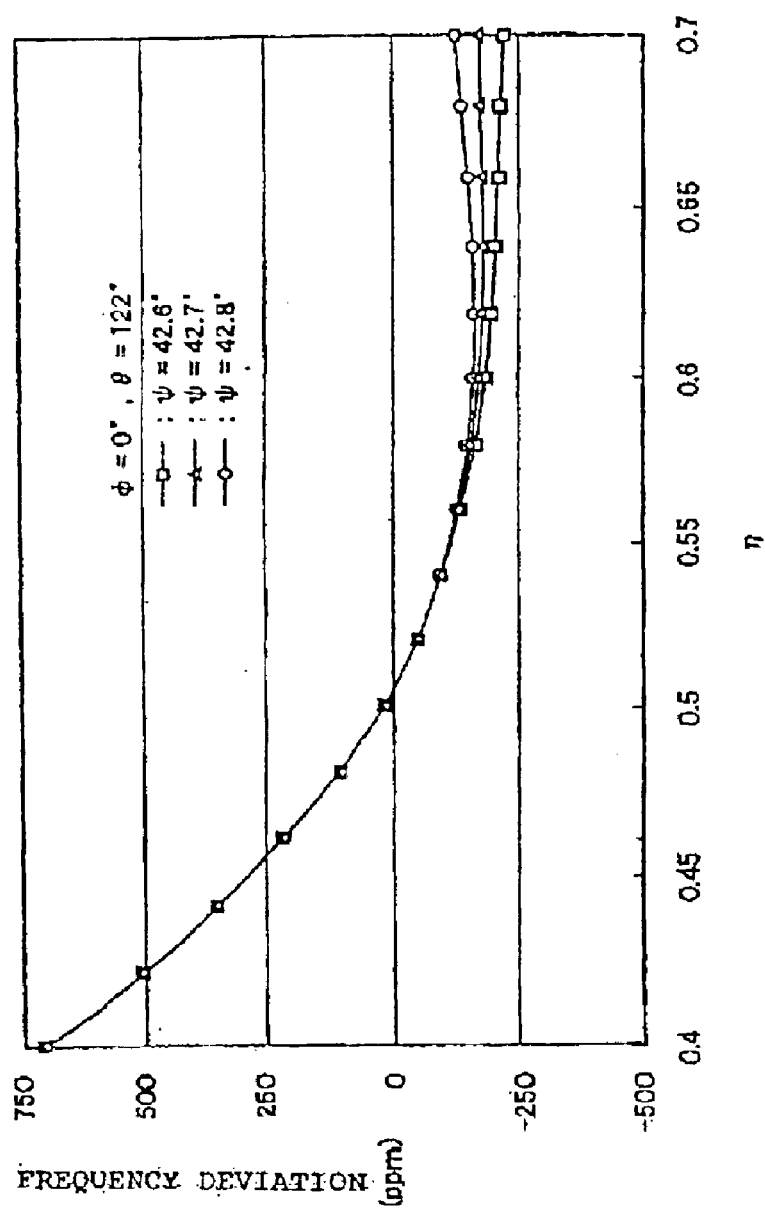
FIG. 8 is a diagram showing the relationship between the electrode width and the resonance frequency deviation of an in-plane rotational ST-cut SAW resonator having Eulerian angles of (0°, 122°, and 42.6° to 42.8°) according to the embodiment.
Figure 9:
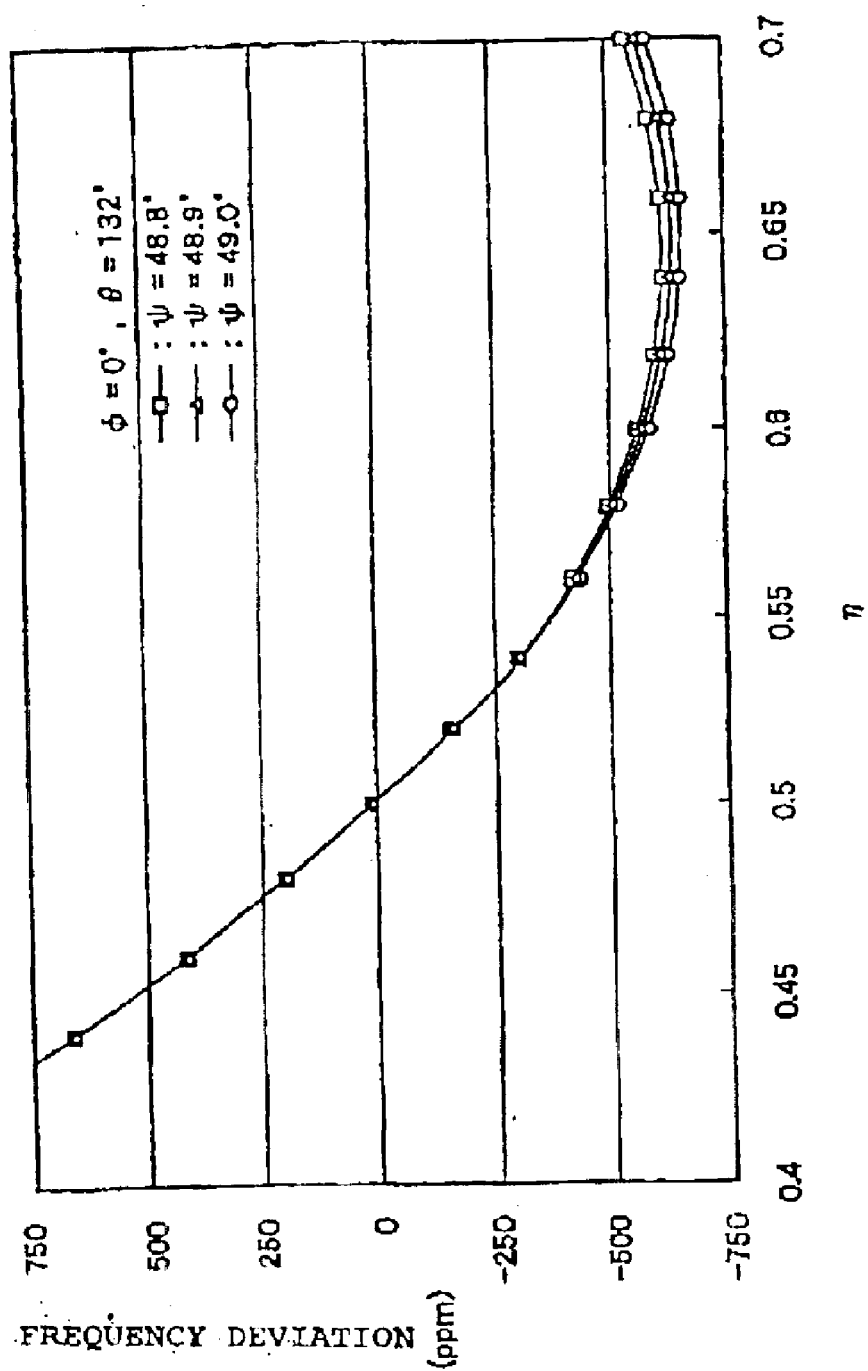
FIG. 9 is a diagram showing the relationship between the electrode width and the resonance frequency deviation of an in-plane rotational ST-cut SAW resonator having Eulerian angles of (0°, 132°, and 48.8° to 49.0°) according to the embodiment.
Figure 10:
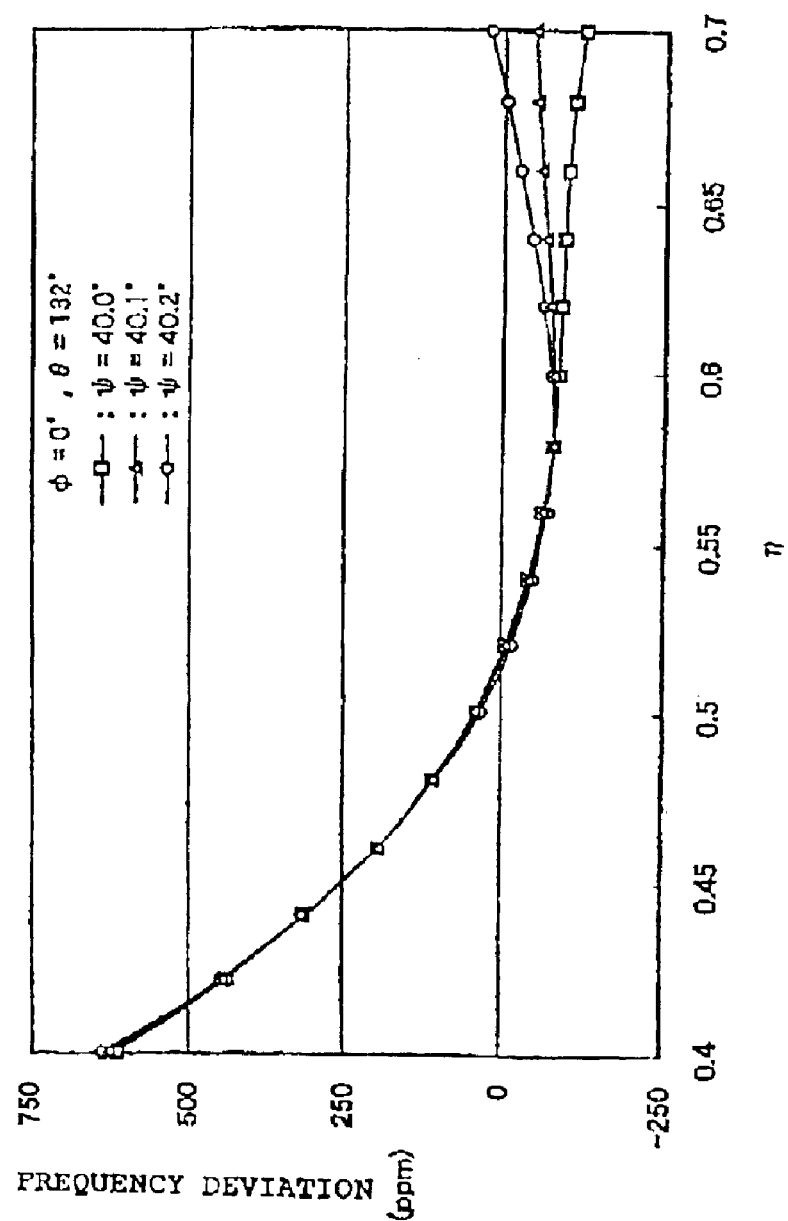
FIG. 10 is a diagram showing the relationship between the electrode width and the resonance frequency deviation of an in-plane rotational ST-cut SAW resonator having Eulerian angles of (0°, 132°, and 40.0° to 40.2°) according to the embodiment.

As indicated in FIGS. 5–10, if the Eulerian angles are (φ, θ, and ψ), φ=0° holds. In FIGS. 5 and 6, θ=117° holds. In FIG. 5, a square mark indicates that ψ=46.4°, a triangle mark indicates that ψ=46.5°, and a circle mark indicates that ψ=46.6°. In FIG. 6, a square mark indicates that ψ=44.9°, a triangle mark indicates that ψ=45.0°, and a circle mark indicates that ψ=45.1°. In FIGS. 7 and 8, θ=122° holds. In FIG. 7, a square mark indicates that ψ=46.9°, a triangle mark indicates that ψ=47.0°, and a circle mark indicates that ψ=47.1°. In FIG. 8, a square mark indicates that ψ=42.6°, a triangle mark indicates that ψ=42.7°, and a circle mark indicates that ψ=42.8°. In FIGS. 9 and 10, θ=132° holds. In FIG. 9, a square mark indicates that ψ=48.8°, a triangle mark indicates that ψ=48.9°, and a circle mark indicates that ψ=49.0°. In FIG. 10, a square mark indicates that ψ=40.0°, a triangle mark indicates that ψ=40.1°, and a circle mark indicates that ψ=40.2°.

Figure 11:
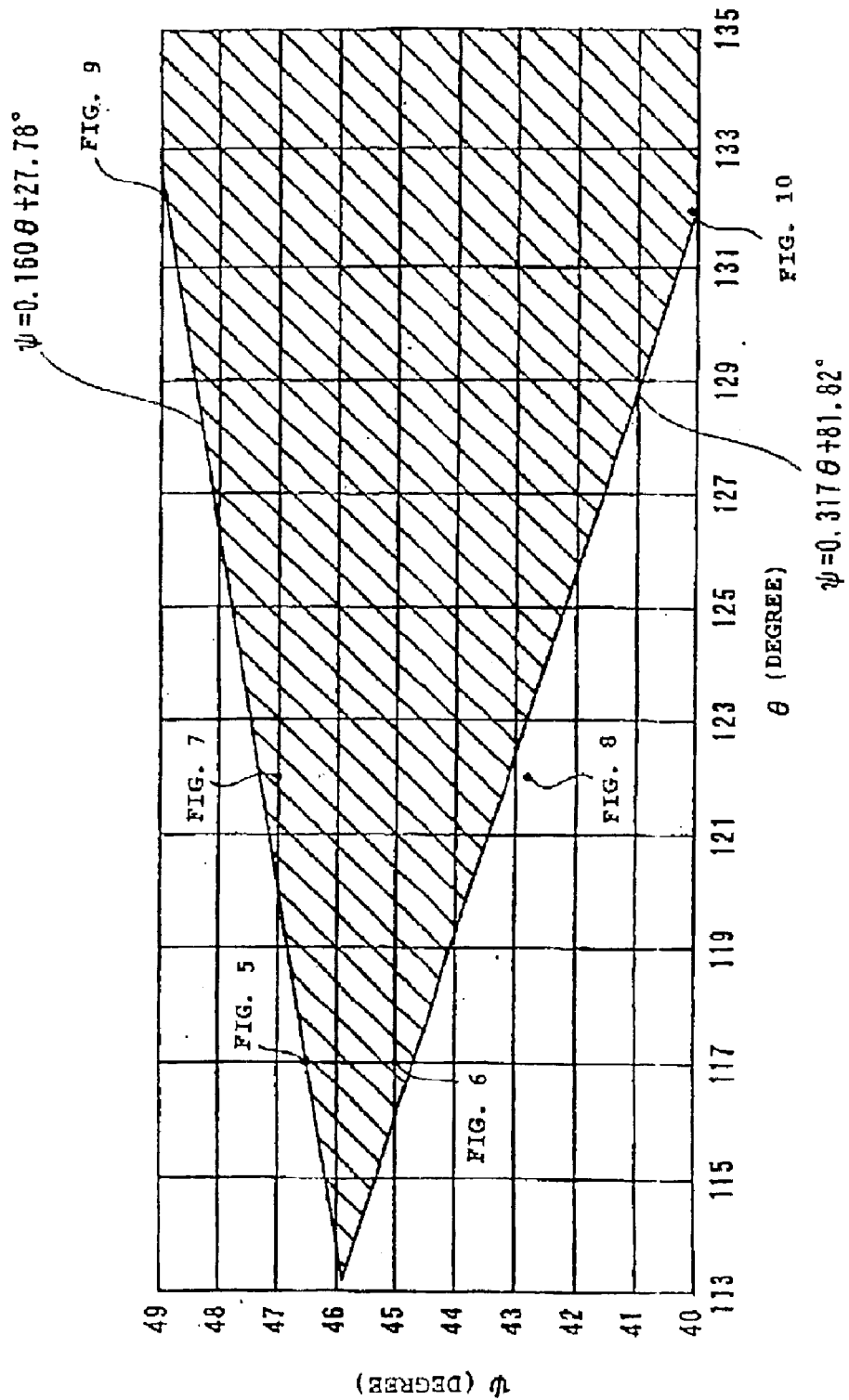
FIG. 11 is a diagram showing the range of $\psi$ relative to $\theta$, which is obtained on the basis of FIGS. 5 to 10 where the Eulerian angles are ($\phi$, $\theta$, and $\psi$)

The upper and lower limits of ψ relative to θ in the region of θ and ψ where the slope of the characteristic line is 0 obtained from the results shown in the drawings are shown in FIG. 11, where the line indicating the lower limit is expressed by $$\psi = -0.317\theta + 81.82°$$ [Equation 1]

and the upper limit is expressed by $$\psi = 0.160\theta + 27.78°$$ [Equation 2]

The range of ψ relative to θ is indicated by the diagonally shaded area in FIG. 11. The characteristic line has a slope 0 in the diagonally shaded area, where the deviation of resonance frequency relative to the fluctuation of η is extremely small.

Since the in-plane rotational ST-cut crystal plate is the same in the case where ψ is rotated positively as in FIG. 1 and in the case where ψ is rotated negatively oppositely from FIG. 1, the lower limit of ψ is expressed by $$|\psi| = |-0.317\theta + 81.82°|$$ [Equation 3]

and the upper limit is expressed by $$|\psi| = |0.160\theta + 27.78°|$$ [Equation 4]

Figure 12:
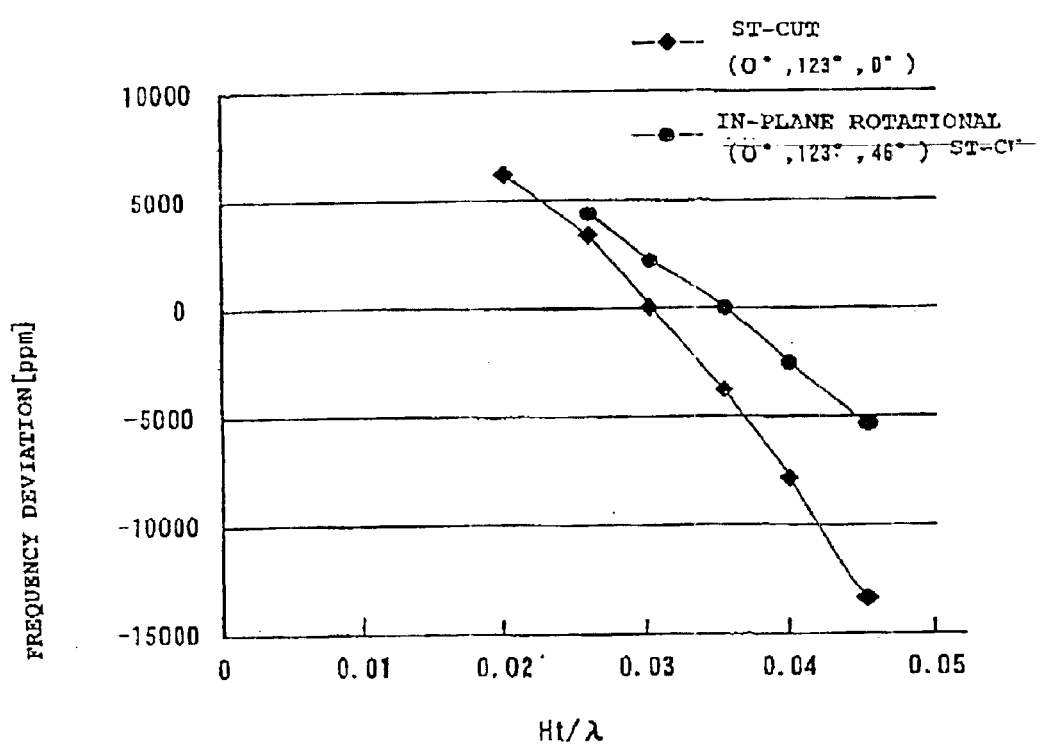
FIG. 12 is a diagram comparing the deviation of resonance frequencies relative to the electrode film thickness for the conventional ST-cut SAW resonator and the in-plane rotational ST-cut SAW resonator according to the embodiment.

The in-plane rotational ST-cut SAW resonator 30 having Eulerian angles of (0°, 113° to 135°, and ±(40° to 49°)) is found to have a small deviation of resonance frequency relative to the variations in the film thickness Ht of the IDT electrode 14 as compared with the conventional ST-cut SAW resonator. FIG. 12 shows the relationship between the variations in the electrode film thickness of the IDT electrode 14 and the deviation of resonance frequency, wherein the horizontal axis indicates Ht/λ and the vertical axis indicates the deviation of resonance frequency in ppm, where Ht in the horizontal axis denotes the film thickness of the IDT electrode 14 and λ denotes the wavelength of the resonance frequency of the surface acoustic wave.

Mark ♦ indicates the measurement results of the conventional ST-cut SAW resonator having Eulerian angles of (0°, 123°, and 0°), showing frequency deviation with reference to Ht/λ=0.03. Mark ● indicates the measurement results of the in-plane rotational ST-cut SAW resonator 30 having Eulerian angles of (0°, 123°, and 46.0°), showing frequency deviation with reference to Ht/λ=0.035.

As can be seen from FIG. 12, the in-plane rotational ST-cut SAW resonator 30 according to the embodiment exhibits smaller fluctuation in resonance frequency with respect to the change in the electrode film thickness Ht as compared with the conventional ST-cut SAW resonator. Thus, in the in-plane rotational ST-cut SAW resonator 30, the control of electrode etching in controlling the frequency is simplified, allowing the reduction of the frequency deviation of SAW resonators formed in the same wafer.

For example, for the SAW resonator having a resonance frequency of 300 MHz, in order to set the frequency deviation when the electrode width Lt of the IDT electrode is controlled to a certain value to the range of ±30 kHz (=±100 ppm), provided that the reference electrode-film thickness is set to Ht/λ=0.03, the tolerance Δ(Ht/λ) amounts to approximately ±0.00013 and the electrode film thickness Ht amounts to 315.0±1.366 nm in the conventional ST-cut SAW resonator. On the other hand, in the in-plane rotational ST-cut SAW resonator according to this embodiment, provided that the reference electrode-film thickness is set to Ht/λ=0.03, the tolerance Δ(Ht/λ) amounts to approximately ±0.00022 and the electrode film thickness Ht amounts to 326.1±2.391 nm. In other words, the in-plane rotational ST-cut SAW resonator of this embodiment has approximately a twice as large tolerance of the electrode film thickness as that of the conventional ST-cut SAW resonator. Therefore, the in-plane rotational ST-cut SAW resonator can have a small range of variation in resonance frequency in the same wafer, facilitating the control of the resonance frequency by electrode etching and so on.

Figure 13:
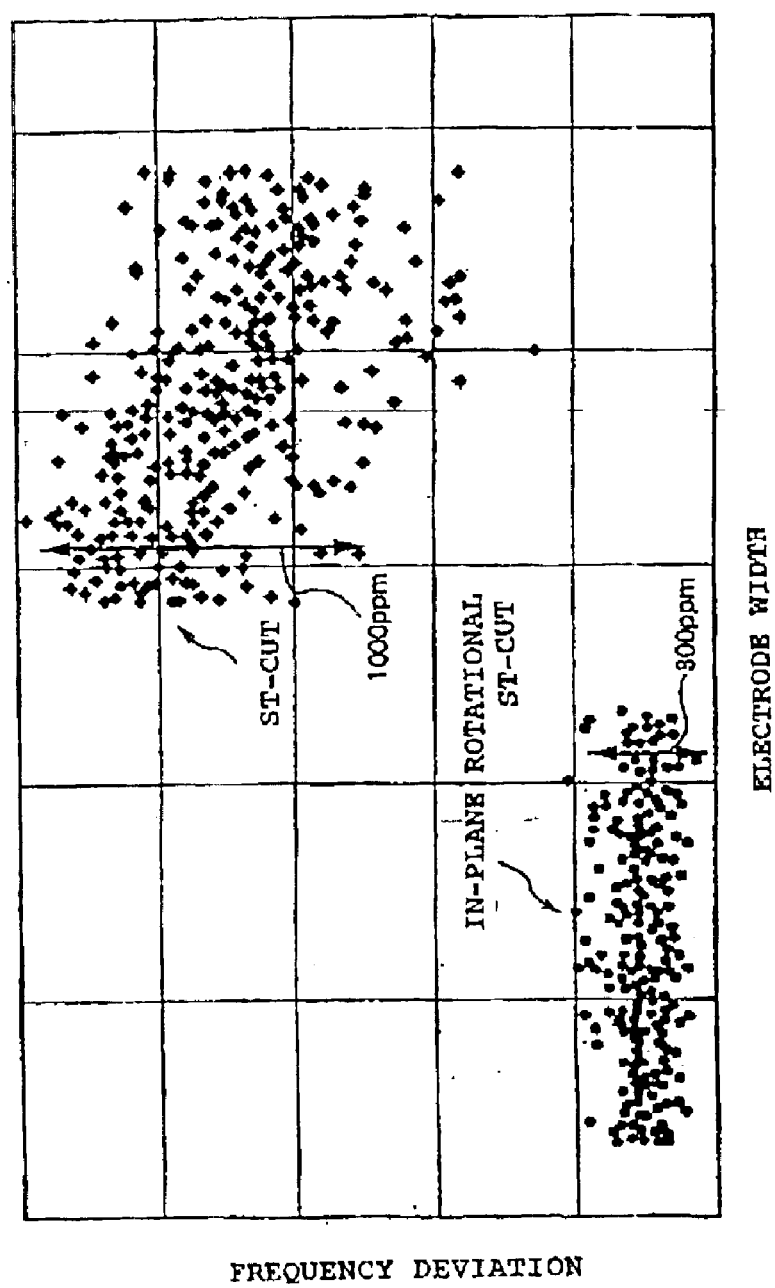
FIG. 13 is a diagram showing the distribution of the variations in resonance frequency due to the variations in film thickness in the same wafer for the conventional ST-cut SAW resonator and the in-plane rotational ST-cut SAW resonator according to the embodiment.

FIG. 13 shows the fluctuation of the resonance frequency due to the variations in the electrode film thickness Ht when the electrode width Lt of the IDT electrodes of the SAW resonators formed in the same wafer is regulated to a certain value. The horizontal axis in the drawing indicates the electrode width Lt and the vertical axis indicates the frequency deviation of the resonance frequency in ppm. The lower left group in the drawing are the in-plane rotational ST-cut SAW resonators according to the embodiment. The upper right group are the conventional ST-cut SAW resonators.

The in-plane rotational ST-cut SAW resonators used for measurement are each formed of a crystal plate having Eulerian angles of (0°, 123°, and 43°), wherein the resonance frequency is 806 MHz and the target electrode-film thickness Ht is 130±1.3 nm. The conventional ST-cut SAW resonators are each formed of a crystal plate having Eulerian angles of (0°, 123°, and 0°), wherein the resonance frequency is 863 MHz and the target electrode-film thickness Ht is 90±0.9 nm. The arrows shown in the drawing indicate the range of frequency deviation ±3σ. The range of ±3σ was approximately 300 ppm for the in-plane rotational ST-cut SAW resonators, and approximately 1000 ppm for the conventional ST-cut SAW resonators. Since a large factor of causing variations in frequency in spite of the same line width is the electrode thickness, the variations in the resonance frequency in FIG. 13 are presumed to be due to the variations of the film thickness Ht of the IDT electrode.

Also, it has been shown that the in-plane rotational ST-cut SAW resonator according to the embodiment also exhibits a superior characteristic against aging that is a secular change of resonance frequency. The secular change of resonance frequency is presumed to be caused by the change in the electrode film thickness of the IDT electrode because of residual gas and so on used in the process of manufacturing the SAW resonator.

Figure 14:
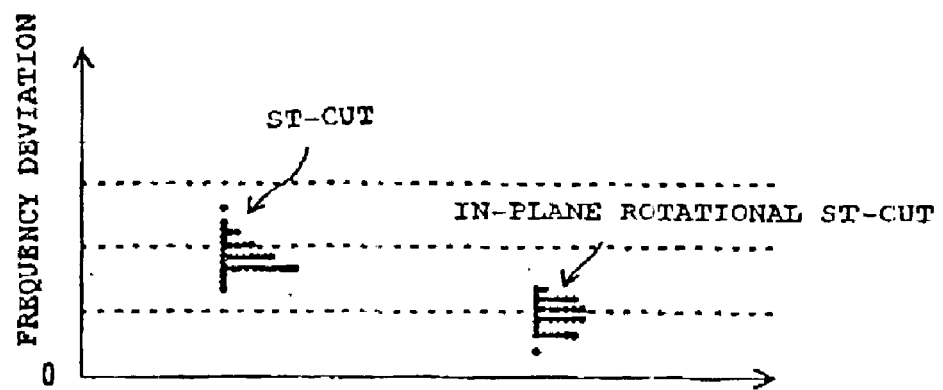
FIG. 14 is a comparative diagram of aging characteristics for the conventional ST-cut SAW resonator and the in-plane rotational ST-cut SAW resonator according to the embodiment.

Accordingly, an aging test was conducted for the conventional ST-cut SAW resonator and the in-plane rotational ST-cut SAW resonator according to the embodiment and their results were compared. Any of used test samples have a resonance frequency of 644 MHz. In the aging test, after left in a thermostat of 125° for 1000 hours, each of the test samples were taken out from the thermostat and cooled to room temperature. Thereafter the resonance frequency was measured to obtain the amount of fluctuation relative to the resonance frequency before it was put in the thermostat. FIG. 14 shows the results. As clearly shown in FIG. 14, the in-plane rotational ST-cut SAW resonator according to the embodiment exhibits half of the amount of fluctuation in resonance frequency as compared with the conventional ST-cut SAW resonator, thus realizing a surface acoustic wave device having a superior aging characteristic.

Figure 15:
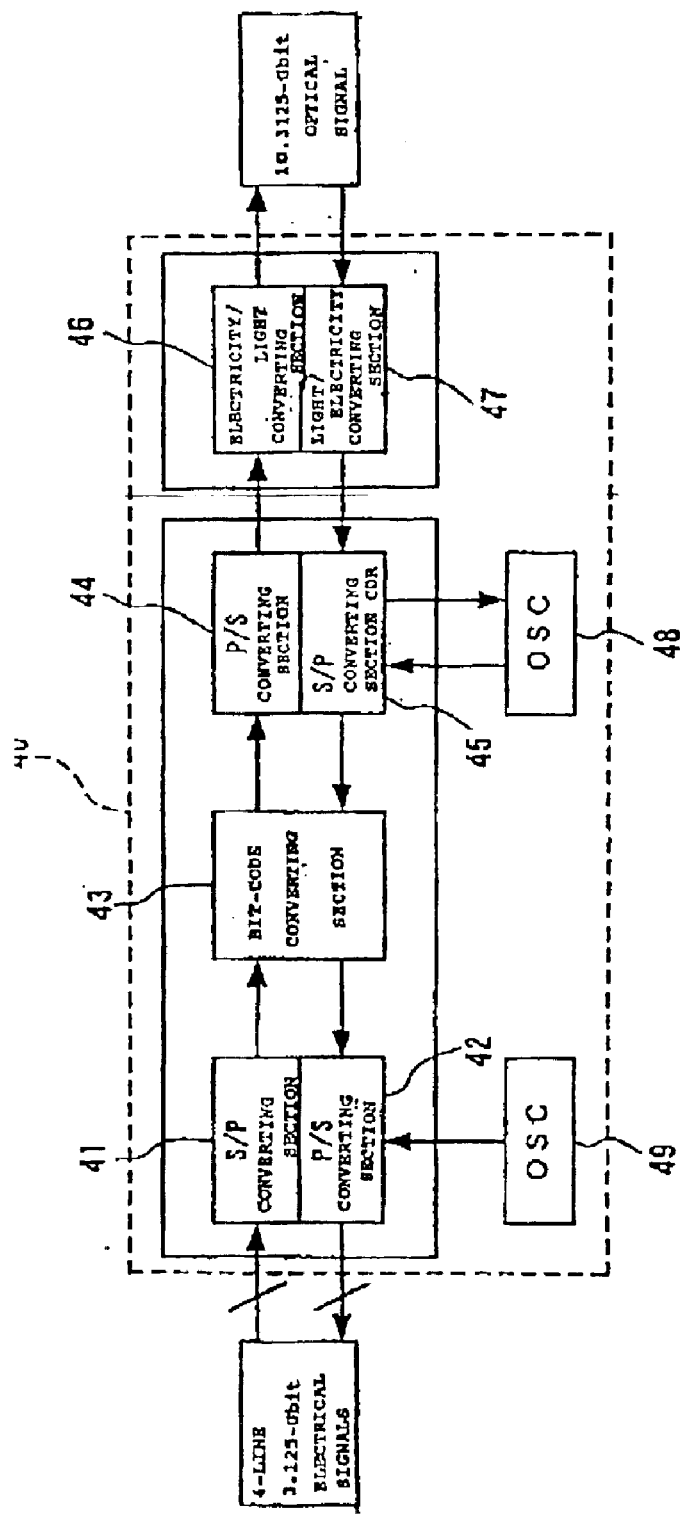
FIG. 15 is a schematic block diagram of a communications apparatus according to the embodiment.

FIG. 15 is an exemplary schematic block diagram of an optical interface module that is a communications apparatus according to an embodiment having the surface acoustic wave device according to the present invention. Referring to FIG. 15, the optical interface module 40 converts a light signal and an electrical signal to each other to perform the transmission and reception of data through an optical network. The optical interface module 40 of this embodiment converts, for example, a 10.3125-Gbit light signal and a 3.125-Gbit electrical signal (four lines) to each other.

More specifically, the optical interface module 40 is equipped with an electricity/light converting section 46. The electricity/light converting section 46 converts an electrical signal inputted from a P/S (parallel/serial) converting section 44 to a light signal and outputs it to an optical network. Also, in the optical interface module 40, a light/electricity converting section 47 converts a light signal outputted from the optical network to an electrical signal and outputs it to an S/P (serial/parallel) converting section 45.

The optical interface module 40 includes oscillators (OSCs) 48 and 49 which are surface acoustic wave devices having the in-plane rotational ST-cut SAW resonators 30 described above. These oscillators 48 and 49 output clock signals of a constant frequency for a long period of time. The clock signals outputted from the oscillators 48 and 49 are applied as reference signals to a 3.125-Gbit S/P converting section 41 and P/S converting section 42, which are connected via a bit-code converting section 43, and to a 10.3125-Gbit P/S converting section 44 and S/P converting section 45.

The optical interface module 40 with such an arrangement can stably transmit and receive data via an optical network for a long period of time. This produces the effect in that a high-speed communications network system represented by 10-gigabit Ethernet capable of transmitting a large amount of data, such as a moving image, can easily maintain a stable operation for a long period of time.

As describe above, according to the present invention, the fluctuation of resonance frequency can remarkably be reduced relative to the variations in the electrode width of an IDT electrode. Therefore, the present invention requires no expensive and high-precision aligner and the like. Also the frequency of a formed SAW resonator can easily be controlled, so that the time for controlling the frequency can be shortened and the cost can be reduced.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A surface acoustic wave device having an interdigital transducer electrode that excites a Rayleigh wave on a main surface of an in-plane rotational ST-cut crystal plate having Eulerian angles of (0°, 113° to 135°, and ±(40° to 49°)), a ratio of an electrode width (Lt) and an interelectrode pitch (Pt) of said interdigital transducer electrode being 0.5 or more and 0.65 or less, when said Eulerian angles are expressed by ($\phi$, $\theta$, and ±$\psi$), that a lower limit of $\psi$ is within the range of $|\psi|=|-0.317\theta+81.82°|$, and an upper limit of $\psi$ is within the range of $|\psi|=|0.160\theta+27.78°|$.

2. A communications apparatus including the surface acoustic wave device as recited in claim 1.

* * * * *